(12) United States Patent
Sung

(10) Patent No.: US 6,840,424 B2
(45) Date of Patent: Jan. 11, 2005

(54) COMPRESSION BONDING TOOLS AND ASSOCIATED BONDING METHODS

(76) Inventor: Chien-Min Sung, 64 Chung-San Road, Ying-Ko Factory, Taipei County (TW), 23911

( * ) Notice: Subject to any disclaimer, the term of this patent is extended or adjusted under 35 U.S.C. 154(b) by 0 days.

(21) Appl. No.: 10/268,016

(22) Filed: Oct. 8, 2002

(65) Prior Publication Data

US 2004/0065711 A1 Apr. 8, 2004

(51) Int. Cl.$^7$ .............................. B23K 37/00; B23K 1/06
(52) U.S. Cl. ......................... 228/4.5; 228/1.1; 228/44.7; 228/180.5
(58) Field of Search ................................ 228/4.5, 44.7, 228/180.5, 1.1

(56) References Cited

U.S. PATENT DOCUMENTS

| | | | |
|---|---|---|---|
| 5,079,102 A | * | 1/1992 | Tanaka et al. ............... 428/627 |
| 5,197,651 A | | 3/1993 | Nakamura et al. |
| 5,370,299 A | | 12/1994 | Tanabe et al. |
| 5,425,491 A | | 6/1995 | Tanaka et al. |
| 5,516,027 A | * | 5/1996 | Tanabe et al. ............. 228/44.7 |
| 5,653,376 A | * | 8/1997 | Nakamura et al. ......... 228/44.7 |
| 6,270,898 B1 | * | 8/2001 | Yamamoto et al. ......... 428/408 |
| 6,651,864 B2 | * | 11/2003 | Reiber et al. ................ 228/4.5 |
| 2002/0077054 A1 | * | 6/2002 | Sung .......................... 451/540 |
| 2003/0082889 A1 | * | 5/2003 | Maruyama et al. ......... 438/455 |

FOREIGN PATENT DOCUMENTS

GB 2254032 A * 9/1992

* cited by examiner

*Primary Examiner*—L. Edmondson
(74) *Attorney, Agent, or Firm*—Thorpe North & Western, LLP

(57) ABSTRACT

Compression bonding tools having a CVD-formed pressing member with a non-reactive working surface are disclosed and described. Generally speaking, the pressing member is coupled to a tool body, which may include head member, and a tail member. In some aspects, the tool body may include a support member of a super hard material that is coupled to the pressing member along a bonding surface thereof. Further, in some aspects, the tool body may contain a heat directing member that facilitates the transfer of heat energy in a direction toward the pressing member. Such compression bonding tools have been found useful in a variety of well-known procedures, such as tap bonding systems (TAB).

24 Claims, 2 Drawing Sheets

COMPRESSION BONDING TOOLS AND ASSOCIATED BONDING METHODS

FIELD OF THE INVENTION

The present invention relates generally to devices for bonding two or more metal materials together. More particularly, the present invention relates to bonding tools for soldering semiconductor chips to lead frames. Accordingly, the present application involves the fields of physics, chemistry, electricity, and material science.

BACKGROUND OF THE INVENTION

Many of the advances made in the electronics industry have occurred due to increasing miniaturization of circuits and chip components. This has been especially true in the computer industry, where increasingly smaller processor components have allowed additional speed and portability to occur. In order to package integrated circuits (IC), miniature wires must be soldered to the electrodes of a chip. The most widely used process for making these connections has become known as a "tap bonding system" (TAB).

Most chips are designed to contain an array of electrodes that terminate on an exterior portion of the chip, and show up as miniature pads or posts. Each of these pads is coated with a thin layer of solder alloy, and must be individually connected to a lead wire that integrates the circuit. While the electrodes must be each individually connected to specific lead wires, the process of making the connections is typically accomplished in a bonding single step. Using the well known TAB process, an array of electrodes and lead wires can become bonded in a single step.

A typical TAB process is generally shown in FIG. 1. A plurality of microchips 10, having electrodes 15, that are typically made of gold and spaced about 100 microns apart, are positioned on a flat surface 12, moving in a fixed direction 17 in a configuration that allows the electrodes to become aligned with one or more lead wires 20. Each electrode is coated with a thin layer of a solder (e.g. tin). The lead wire is fed by carrier tape, or film, 25 over the chips. The bonding of the electrodes to the lead wire is achieved by pressing the lead wire on top of each of the electrodes by a compression bonding tool 30. The bonding tool is heated to a designated temperature, typically 500–600° C. While the lead wire and electrodes are pressed together, heat flows from the bonding tool to the wire and it causes the solder on top of the electrode to melt so the lead wire becomes bonded to the electrode almost instantaneously.

Referring again to FIG. 1, the bonding tool 30 used in most TAB processes typically includes two portions, a head 35 and a tail 40. The head has a body 45 and a pressing face 50. The body often contains a heater (not shown) which can be heated by passing electricity through a resistor as is known in the art. The pressing face is typically made of diamond, in particular, a CVD formed diamond film. The tail is used to attach to the bonding tool to other machinery which is capable of moving the bonding tool in at least an up and down motion in order to achieve the pressing action responsible for bonding the electrodes to the lead wire.

In use, the bonding tool 30 is lowered and pressed against the carrier tape 25 which feeds the lead wires 20 over the electrodes 15. Thus the lead wires become pressed against the electrodes, and the heat transferred from the pressing face 50 of the bonding tool melts the solder on the electrodes and forms a bond with the lead wires. As soon as the bonding is completed, the bonding tool is raised, so that the carrier tape will advance with the chip attached underneath. The bonding tool is now ready to perform another pressing operation.

A number of characteristics dictate the quality of bond attained by the bonding tool. Such characteristics include, the effectiveness of heat transfer from the head to the pressing face, the flatness and reactivity of the pressing face, the distribution of heat throughout the pressing face, and the quality of attachment between the tail and the machine holding the bonding tool.

One issue facing the attachment of the tail to a machine is the transfer of heat from the head of the bonding tool through the tail, and into the machine holding the tool. Because such a transfer wastes heat energy, and because heating of the machine holding the tool is typically undesirable, the handle of traditional bonding tools has been made from a material having low thermal conductivity (i.e. heat insulating), such as Kovar, Invar, or iron-cobalt-nickel alloys.

In order to address the issues of pressing face flatness, hardness, reactivity, and heat distribution, diamond has become popular for its desirable properties in each of these areas. Particularly, CVD formed diamond has received great interested because of its cost effectiveness and ability to be deposited over a large surface area.

Despite its popularity for use in making bonding tool pressing faces, CVD formed diamond contains a number of disadvantages. For example, due to bonding and thermal expansion issues CVD diamond, may only be deposited onto a selected group of materials, such as refractory elements that react with diamond to form carbide, or certain ceramic materials that have similar thermal expansion values. Other issues also continue to persist. For example, the sticking of solder and other materials to the pressing face during repeated use of a tool continues to be problematic. The fouling of the pressing face with such materials is thought to be due at least in part, to the CVD process by which the diamond is made. While diamond itself is extremely inert, the CVD process of making diamond leaves unbound electrons on many of the carbon atoms at the pressing surface. This is due to the termination of the deposition process upon completion of a diamond mass. These unbound electrons or "dangling bonds" have a significant propensity to react with other materials with which they come in contact. Therefore, the pressing surface may become fouled over time and the useful life thereof is significantly decreased.

In addition to the ongoing issues with CVD diamond, other issues persist with current bonding tools as a whole. For example, despite the use of materials having a low thermal conductivity, heat loss and subsequent warming of the machine holding the bonding tool remains. This is due in part to insufficient or sub-optimal transfer of heat through the head and to the pressing face. Moreover, due to the heat loss in the tail, maintenance of the operating temperature at the pressing face is difficult. Additionally, most of the materials currently used to support the CVD diamond pressing face, are insufficiently rigid to adequately support the diamond over a large number of pressings. Over time, this lack of rigidity allows the diamond to begin flexing under pressure, and leads to chipping of the diamond around the corners of the pressing face. Lack of rigidity can also allow the diamond face cave in the middle, so that the center lead is not pressed as hard. Furthermore, thermal expansion mismatching and tool expense remain as problems As such, bonding tools that provide improved performance, durability, and efficiency continue to be sought through ongoing research and development efforts.

SUMMARY OF THE INVENTION

Accordingly, the present invention provides compression bonding tools for use in various TAB processes. Such tools generally contain the basic elements of a tail member or shank, a head member coupled to the tail member, and a pressing member coupled to the head member. In one aspect of the present invention, the pressing member may include a layer of CVD-formed diamond and have a non-reactive working surface. The pressing member is generally bonded to the head member along the bonding surface of the pressing member, which is typically opposite the working surface. The head member is coupled to a tail member, which can be coupled to a machine to enable up and down motion of the bonding tool.

In another aspect of the present invention, the head member may contain a support member of a super hard material that is coupled along the bonding surface of the pressing member. The super hard support material may be a single piece substrate that is compression fitted into the head member. Moreover, an interface layer of an interface material, such as Ag, or Cu, that is increases the efficiency of heat transfer into the support member may be disposed between the support member and the head member.

The non-reactivity of the working surface of the pressing member may be attained in various ways. In one aspect, the non-reactivity may be achieved by removing substantially all dangling bonds from the working surface of a CVD-formed diamond layer. Bonding free electrons on the working surface of the diamond layer with other elements having a single free valence electron, such as hydrogen or a halogen has been discovered to reduce the reactivity of the working surface with the materials it comes in contact with during use. In another aspect, the working surface may be rendered non-reactive by creating it from a material that has no dangling bonds, such as by coating the CVD-formed diamond mass with a layer or film of a diamond-like material. For example, the working surface may be of amorphous diamond, diamond-like-carbon (DLC), etc.

There has thus been outlined, rather broadly, several features of the invention so that the detailed description thereof that follows may be better understood, and so that the present contribution to the art may be better appreciated. Other features of the present invention will become clearer from the following detailed description of the invention, taken with the accompanying drawings and claims, or may be learned by the practice of the invention.

DETAILED DESCRIPTION

Figure 1:
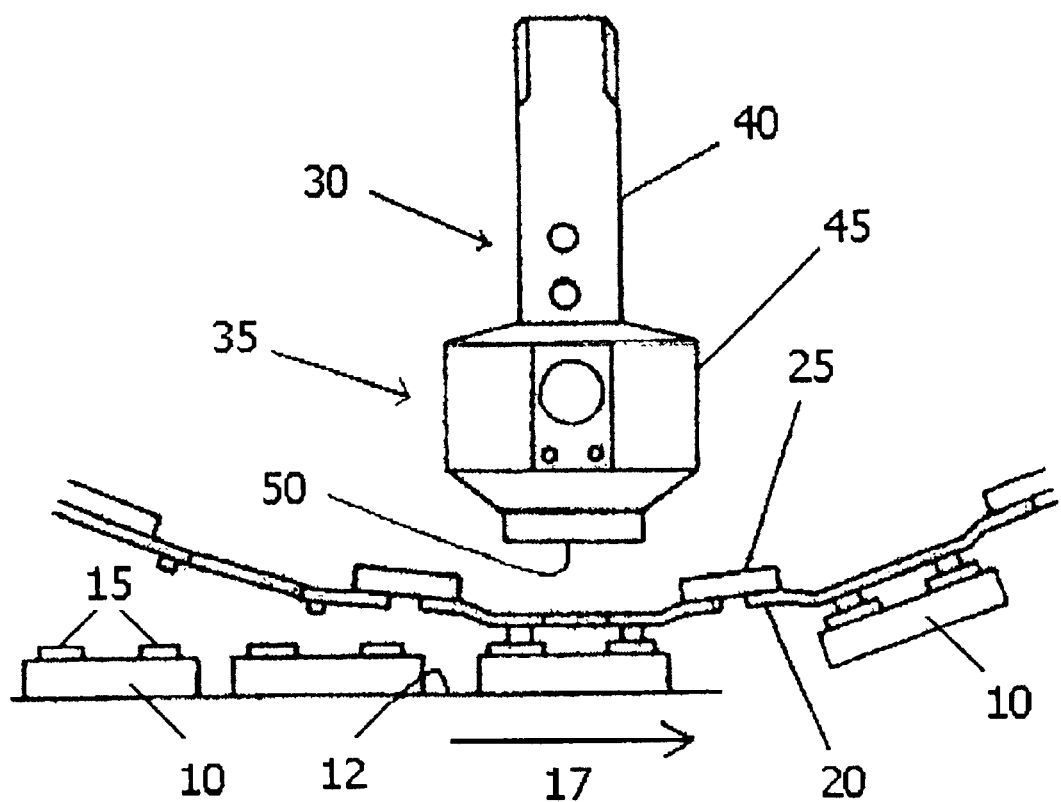
FIG. 1 shows a side view of a typical process for bonding lead wires to the electrodes of microchips, and a bonding tool for effecting such bonding in accordance with the prior art.

Before the present invention is disclosed and described, it is to be understood that this invention is not limited to the particular structures, process steps, or materials disclosed herein, but is extended to equivalents thereof as would be recognized by those ordinarily skilled in the relevant arts. It should also be understood that terminology employed herein is used for the purpose of describing particular embodiments only and is not intended to be limiting.

It must be noted that, as used in this specification and the appended claims, the singular forms "a," "an," and, "the" include plural referents unless the context clearly dictates otherwise. Thus, for example, reference to "a bonding tool" includes one or more of such tools, reference to "an amount of carbon" includes reference to one or more amounts of carbon, and reference to "the diamond material" includes reference to one or more diamond materials.

Further, it is to be noted that the reference numerals used herein in the figures and specification have each been assigned to a single element of the illustrated embodiments of the devices of the present invention. Therefore, the same reference numerals are used in each figure to refer to the assigned tool element. For example, numeral 35 has been assigned to the head member of the described tool. Therefore, it is included in each of the figures to refer to the head member.

Definitions

In describing and claiming the present invention, the following terminology will be used in accordance with the definitions set forth below.

As used herein, "bonding tool," "compression bonding tool," and "pressing tool" may be used interchangeably, and refer to a tool that is used in a TAB process for facilitating a solder connection between a lead wire and an electrode. A number of specific tools of this type are well-known to those of ordinary skill in the art, such as those found in U.S. Pat. Nos. 5,197,651, 5,370,299, 5,425,491, 5,516,027, and 5,653,376, each of which is incorporated herein by reference.

As used herein, "diamond" refers to a crystalline structure of carbon atoms bonded only to other carbon atoms in a lattice of tetrahedral coordination known as $sp^3$ bonding. Other "diamond-like" compounds are known and vary slightly from the structural or chemical characteristics of pure diamond, while retaining many of the same physical properties, such as hardness, inertness, etc. Portions of a diamond material that contain impurities, such as a carbon atom bonded to less than four other carbon atoms in a tetrahedral configuration are not considered to be "diamond," but are considered to be "diamond-like". For example, a carbon atom that is bonded to three other carbon atoms in a substantial or modified tetrahedral configuration, and that is also bonded to a hydrogen or a halogen in place of the fourth carbon atom is considered to be "diamond-like". Typical names for such materials include diamond-like carbon and amorphous diamond, among others.

As used herein, "super hard" refers to any crystalline, or polycrystalline material, or mixture of such materials which has a Moh's hardness of 9 or greater. Such materials include but are not limited to diamond, polycrystalline diamond (PCD), cubic boron nitride (cBN), polycrystalline cubic boron nitride (PCBN) as well as other super hard materials known to those skilled in the art. Super hard materials may be incorporated into the present invention in a variety of forms including particles, grits, films, layers, etc.

As used herein, "non-reactive" refers to the unavailability of a substance for chemical reaction under a given set of conditions. For example, a substance that would normally react with a second substance at a certain temperature and pressure may be modified so that no chemical reaction will take place under the same conditions. In this case, the modified substance would be considered to be "non-reactive."

As used herein, "dangling bonds" refers to unbound or unshared valence electrons in a carbon atom, which are available to become bound to or react with an electron from another atom.

As used herein, "working surface" refers to the surface of a tool, that contacts a workpiece during a work operation.

As used herein, "metallic" refers to a metal, or an alloy of two or more metals. A wide variety of metallic materials are known to those skilled in the art, such as aluminum, copper, chromium, iron, steel, stainless steel, titanium, tungsten, zinc, zirconium, molybdenum, etc., including alloys and compounds thereof.

As used herein, "refractory" refers to a metal element that typically has a melting point above 1400° C., and that is capable of reacting with or "wetting" a superabrasive particle to form a chemical bond therewith. Examples of such elements include without limitation, W, W—Cu, Mo, Ta, Ti, Cr, Zr, Nb, and Hf, as well as alloys thereof.

As used herein, "compression fit" refers to a mechanical or friction fit between two or more components of a bonding tool that is sufficient to hold the components together during use of the tool.

As used herein, "heat directing member," and "heat conducting channel" may be used interchangeably, and refer to a zone or portion of a tool which is specifically designed to facilitate a directional flow of heat energy. A number of specific ways of inducing such a directional flow may be employed, such as through the use of certain materials that are more conductive than surrounding materials. Moreover, in some aspects, such materials may be used not only to conduct heat energy, but may also take part in the generation of heat energy. For example, W may be used as a resistor in connection with an electrical current in order to produce heat as is known in the art.

As used herein, "substantial" when used in reference to a quantity or amount of a material, or a specific characteristic thereof, refers to an amount that is sufficient to provide an effect that the material or characteristic was intended to provide. Further, "substantially free" when used in reference to a quantity or amount of a material, or a specific characteristic thereof, refers to the absence of the material or characteristic, or to the presence of the material or characteristic in an amount that is insufficient to impart a measurable effect, normally imparted by such material or characteristic.

As used herein, a "tool body" refers to the general body of a tool. In some cases, a tool body may contain a number of separate and distinction sections or components, such as a head and a tail. In other cases, a tool body may simply be a shaft, or other piece used to support a pressing member.

As used herein, a "head member" refers to any portion of a compression bonding tool that is operatively coupled to a pressing member. Head members may be made of a variety of materials, and may take nearly any shape or form required by a specific tool design. Moreover, ahead member as used herein, may contain other elements which operatively couple it to the pressing member, such as a support member of various materials, including super hard materials.

As used herein, a "tail member" refers to any portion of a compression bonding tool which is capable of operatively coupling the tool to a machine for use of the tool. Such a tail member may take a wide number of specific configurations and be made of a variety of specific materials in order to achieve a desired purpose.

Concentrations, amounts, and other numerical data may be expressed or presented herein in a range format. It is to be understood that such a range format is used merely for convenience and brevity and thus should be interpreted flexibly to include not only the numerical values explicitly recited as the limits of the range, but also to include all the individual numerical values or sub-ranges encompassed within that range as if each numerical value and sub-range is explicitly recited.

As an illustration, a numerical range of "about 1 micrometer to about 5 micrometers" should be interpreted to include not only the explicitly recited values of about 1 micrometer to about 5 micrometers, but also include individual values and sub-ranges within the indicated range. Thus, included in this numerical range are individual values such as 2, 3, and 4 and sub-ranges such as from 1–3, from 2–4, and from 3–5, etc.

This same principle applies to ranges reciting only one numerical value. Furthermore, such an interpretation should apply regardless of the breadth of the range or the characteristics being described.

The Invention

The present invention involves a compression bonding tool for use various TAB processes. Many compression bonding tools utilize a tool body having three basic elements, namely, a pressing member, a head, and a tail. Examples of a number of specific compression bonding tools include those disclosed in U.S. Pat. Nos. 5,516,027; 5,370,299; 5,197,651; 5,425,491; and 5,653,376, each of which is incorporated herein by reference.

In general, the bonding tool of the present invention includes at least a tool body with a pressing member coupled to the tool body. A number of specific different tool body designs will be appreciated by those of ordinary skill in the art as recited above. One example of a specific tool body may be a simple shaft. However, in one aspect, the tool body used may be a traditional tool body having tail member coupled to a head member, which is further coupled to the pressing member. The pressing member may be made using a conventional CVD technique for fabricating diamond as is known in the art. Moreover, the specific parameters for the pressing member, such as shape, and dimensions, including thickness, length, and width, may all be adjusted by one of ordinary skill in the art in order to accommodate a specific tool design.

In one aspect of the invention, the working surface of the pressing member may be substantially non-reactive. A non-reactive working surface has been found to be advantageous in that it prevents, or at least reduces the propensity of the working surface to become fouled with the various materials that it contacts during use, such as solder compounds, adhesives, etc. As a result, the useful life of the tool is lengthened. Despite the inertness of diamond generally, CVD-formed diamond may contain "dangling bonds" in the carbon atoms that are left exposed upon termination of the deposition process. As is well known, diamond consists of a carbon atom lattice with atoms bonded in a tetrahedral configuration. If viewed one carbon atom at a time, then each carbon atom is surrounded and bonded to four other carbon atoms with bonds of equal length and in Sp3 coordination. However, when a mass of diamond is created using CVD, the outermost surface of the mass may contain carbon atoms that are bound to less than four other carbon atoms as a result of the termination of the deposition process. Therefore, these carbon atoms contain one or more electrons that are unbound or "dangling," and available for reaction with other materials also having one or more free valence electrons. As a result, a working surface with dangling bonds has a greater propensity to react with the materials it comes in physical contact with, thus increasing the rate at which it becomes fouled and decreasing its useful life.

Accordingly, in one aspect of the present invention, the working surface of the CVD-formed diamond pressing member is substantially non-reactive due to the removal of dangling bonds therefrom. One way in which to remove dangling bonds from the working surface is by bonding the dangling bonds with another element that has only one available valence electron, such as a hydrogen or a halogen. In one aspect, the halogen may be a member selected from the group consisting of: F, Cl, Br, I, and mixtures thereof. In another aspect, the halogen may be F.

Those of ordinary skill in the art will recognize that the bonding of such elements to carbon atoms with dangling bonds on the working surface of the pressing member may be accomplished in a number of ways. For example, the pressing member may be heated in an atmosphere of the desired element, such as H, F, Cl, etc., to a temperature sufficient to facilitate bonding, such as about 700° C.

Another way in which the working surface of the pressing member may be rendered non-reactive is by depositing a thin layer or film of a diamond-like material, such as amorphous diamond, diamond-like-carbon (DLC), or carbonitride (CN) on the outer surface of the pressing member to create the working surface. Deposition of such materials may be accomplished using a variety of CVD techniques and conditions, and as will be recognized by those of ordinary skill in the art, may also be accomplished by varying deposition conditions near the end of the CVD process which used to create the diamond portion of the pressing member.

Figure 2:
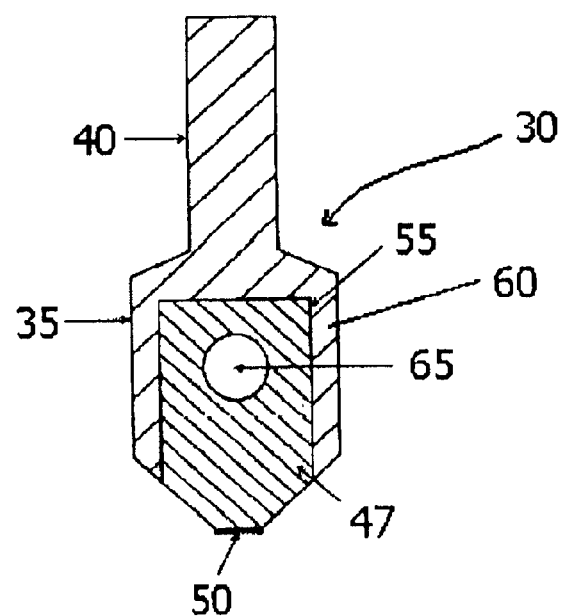
FIG. 2 shows a side cross-sectional view of a compression bonding tool having a pressing member coupled directly to a heat directing member in accordance with one embodiment of the present invention.

Referring now to FIG. 2, there is shown a cross sectional view of a compression bonding tool in accordance with one embodiment of the present invention. The bonding tool 30 has a tail member 40 coupled to a head member 35. Further, the head member is coupled to a pressing member 50 along a bonding surface (not shown) of the pressing member. The pressing member has an outer, or working surface, (not shown) that faces away from the head member, in embodiments where the pressing member is configured as a layer, the working surface of the pressing member is substantially opposite the bonding surface of the pressing member. Notably, the working surface of the pressing member can optionally be a non-reactive working surface as recited above. In use, the tail member is held by a machine (not shown) that is capable of moving the bonding tool in at least an up and down manner, and the tool is heated. The bonding process in accordance with the general parameters outlined above and shown in FIG. 1 is then carried out.

As depicted in FIG. 2, the head member 35 further includes a heating directing member 47 of a heat conducting material, which is at least partially surrounded by an outer wall 60 of the head member. In one aspect of the invention, the outer wall may be made of a heat insulating material. The heat directing member is made of a heat conducting material and serves to conduct heat from a heating source 65 in to the pressing member 50. Moreover, the presence of the surrounding outer wall of the head member which is made of a heat insulating material, further aids the efficiency of the heat transfer from the heat source and into the pressing member.

A variety of heat insulating materials may be used for the outer wall 60, as recited above in the background section. Additionally, as will be recognized by those of ordinary skill in the art, a variety of heat conducting materials may be used for the heat directing member 47. By way of example without limitation, suitable the heat conducting materials may include W, Mo, Ta, Ti, Nb, HF, Cu, as well as mixtures thereof. The specific type and amount of heat conducting material, including those recited above, that is employed in the heat directing member may be determined by one of ordinary skill in the art depending on the final proposed specifications of the bonding tool. However, in one aspect, the heat directing member may include at least about 50% w/w of a refractory metal material selected from the group consisting of: W, Mo, Ta, Ti, Nb, Hf, Cu, and mixtures thereof. In another aspect, the refractory metal material may be W.

In many cases the refractory metal material, due to its resistivity, may also serve as the heat source 65. Coupling resistor materials to an electrical current is a well-known way of generating heat. Those of ordinary skill in the art will recognize the benefits of providing heat to the bonding tool in this manner, including simplicity of design, savings of space, and minimization of required tool parts.

The heat directing member 47 may be coupled to or incorporated into the head member 35 in a number of different ways. However, in one aspect of the invention, the heat directing member 47 may be held in the head member by a compression fit. In short, the metal materials of the head member may be heated up until they expand, allowing the heat directing member to be fitted into the space within the outer wall 60 of the head member. The materials are then cooled, and the subsequent contraction of the metal around the heat directing member friction fits the outer wall the of the head member and the heat directing member together so that the heat directing member is held firmly in the head member.

In one aspect of the invention, an interface layer 55 may be placed between the heat directing member 47 and the insulator material of the outer wall 60 of the head member 35 prior to the compression fitting. As such, the interface layer extends between a portion of the heat directing member and the outer wall of the head member, and in some embodiments, as more fully described below, the interface layer may full surround or encompass the heat directing member. The interface material may be a soft metallic material such as Ag or Cu, in order to fill any gaps that would have otherwise resulted from the compression fitting process. Moreover, in certain embodiments as more fully described below, the interface material may increase the efficiency of the transfer of thermal energy into the pressing member 50. In one aspect, the interface layer may comprise, or consist of Ag, Cu, their alloys, and mixtures thereof. In another aspect, the interface layer may be Ag.

In some aspects of the present invention, the CVD-formed diamond of the pressing member 50 may be directly deposited onto an appropriate portion of the head member 35, for example, the heat directing member 47, when the heat directing member is included in the head member. However, the pressing member may also be separately formed and then brazed onto the head member by a variety of techniques as are known in the art. This same principle applies when the pressing member is attached to a super hard support member as recited below.

Figure 3:
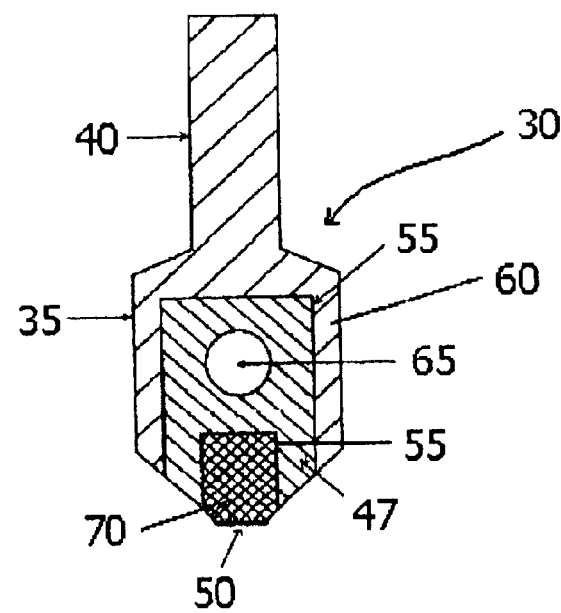
FIG. 3 shows a side cross-sectional view of a compression bonding tool having a pressing member coupled to a support member of a super hard material, which is held in a heat directing member in accordance with another embodiment of the present invention.

Referring now to FIG. 3, is shown a cross-sectional view of a bonding tool in accordance with another embodiment of the present invention. Particularly, in addition to the elements depicted in FIG. 2, the tool of FIG. 3 further includes a support member 70 of a super hard material which supports the pressing member 50 and is coupled along the bonding surface thereof.

The super hard material may be selected from various materials known for their extreme hardness, such as diamond, polycrystalline diamond (PCD), cubic boron nitride (cBN), and polycrystalline cubic boron nitride (PcBN). Such materials have been found to be very useful in supporting the pressing face due to their extreme hardness, efficient heat transfer, and low thermal expansion coefficient. A variety of specific PCD types may be used. By way of example without limitation, in one aspect, the PCD may be a composite of diamond and Si, or SiC. In another aspect, the PCD may contain about 80% diamond and about 20% Si, or SiC. Moreover, when PcBN is used, it may also be a composite material that includes an amount of TiN. In another aspect, the PcBN may contain about 90% cBN and about 10% TiN.

One specific advantage provided by the super hard material is that it reduces or prevents the pressing member from flexing during a pressing operation. As note above, such flexing may lead to the flaking or chipping of the pressing member of a repeated number of pressing operations. However, by reducing or eliminating the ability of the pressing member to flex, such chipping and flaking is avoided, and the useful life of the pressing member is lengthened.

The support member may be coupled to the head member in a variety of way that will be recognized by those of ordinary skill in the art, such as brazing, etc. Referring again to FIG. 3, is shown the support member 70 held in the head member 35 via a compression fit. It has been found that the compression fit mechanism for holding the support member in the head member increases the efficiency of heat transfer from the head and into the support member. Specifically, most conventional brazing materials slow the heat transfer, as well as absorbing some of the heat energy. Notably, as shown in FIG. 3, when the heat directing member 47 is included, the support member may be held therein. Moreover, in order to improve heat transfer speed and efficiency, an interface layer 55 as recited above may be placed between the support member and the head member. As a result of the softness and conductivity of the interface layer material, such as Ag, or Cu, heat transfer speed and efficiency are maximized. In one aspect, the boost in efficiency may be due to the removal of cracks or spaces between the support member and the head member, as can occur with conventional brazing techniques.

Of course, it is to be understood that the above-described arrangements are only illustrative of the application of the principles of the present invention. Numerous modifications and alternative arrangements may be devised by those skilled in the art without departing from the spirit and scope of the present invention and the appended claims are intended to cover such modifications and arrangements. Thus, while the present invention has been described above with particularity and detail in connection with what is presently deemed to be the most practical and preferred embodiments of the invention, it will be apparent to those of ordinary skill in the art that numerous modifications, including, but not limited to, variations in size, materials, shape, form, function and manner of operation, assembly and use may be made without departing from the principles and concepts set forth herein.

What is claimed is:

1. A compression bonding tool comprising:
   a tool body; and
   a pressing member of CVD-formed diamond coupled to the tool body, said pressing member having a working surface which is rendered substantially non-reactive by the attachment of either nitrogen or a halogen to remove dangling bonds.

2. A compression bonding tool comprising:
   a tool body;
   a support member of a super hard material coupled to the tool body; and
   a pressing member of CVD-formed diamond coupled to the support member with a compression fit.

3. The tool of claim 2, wherein the working surface is substantially non-reactive.

4. The tool of claim 3, wherein the working surface is rendered non-reactive by the removal of dangling bonds from the working surface.

5. The tool of either claim 1 or 4, wherein the dangling bonds are bound to an element having only a single valence electron.

6. The tool of claim 5, wherein the non-carbon element is a halogen.

7. The tool of claim 6, wherein the halogen is a member selected from the group consisting of: F, Cl, Br, I, and mixtures thereof.

8. The tool of claim 3, wherein the non reactive working surface comprises a thin layer of carbon and nitrogen over the CVD-formed diamond.

9. The tool of claim 8, wherein the thin layer has a thickness of less than about 1 micrometer.

10. The tool of claim 8, wherein the thin layer is diamond-like-carbon.

11. The tool of claim 2, wherein the super hard material is a member selected from the group consisting of: polycrystalline diamond, polycrystalline cubic boron nitride, and mixtures thereof.

12. The tool of claim 11, wherein the super hard material is polycrystalline diamond.

13. The tool of claim 12, wherein the polycrystalline diamond further includes an element selected from the group consisting of: Si, SiC, and mixtures thereof.

14. The tool of claim 11, wherein the super hard support material is polycrystalline cubic boron nitride.

15. The tool of claim 14, wherein polycrystalline cubic boron nitride further includes TiN.

16. The tool of claim either claim 1, or 2 wherein the tool body further comprises a heat directing member that includes at least about 50% w/w of a refractory metal material selected from the group consisting of: W, Mo, Ta, Ti, Nb, HF, Cu, and mixtures thereof.

17. The tool of claim 16, wherein the refractory metal material is W.

18. The tool of claim 16, wherein the refractory metal material serves as resistor which provides heat upon receipt of electricity.

19. The tool of claim 16, wherein the heating directing member is at least partially surrounded with an insulator material.

20. The tool of claim 16, wherein the heat directing member is held in the tool body by a compression fit.

21. The tool of claim 20, further comprising a an interface layer disposed between the heat directing member and the insulator material.

22. The tool of claim 21, wherein the interface layer substantially surrounds the heat directing member.

23. The tool of claim 21, wherein the interface layer is a material selected from the group consisting of: Ag, Cu, and mixtures thereof.

24. The tool of claim 19, wherein the material is Ag.

* * * * *